United States Patent
Hill et al.

(10) Patent No.: US 8,085,141 B2
(45) Date of Patent: Dec. 27, 2011

(54) SELF-DIAGNOSTIC SWITCH

(75) Inventors: Gerald W. Hill, Palos Park, IL (US);
Brian J. Truesdale, Wauconda, IL (US);
Slawomir P. Kielian, Des Plaines, IL (US)

(73) Assignee: Illinois Tool Works Inc., Glenview, IL (US)

( * ) Notice: Subject to any disclaimer, the term of this patent is extended or adjusted under 35 U.S.C. 154(b) by 1006 days.

(21) Appl. No.: 11/805,009

(22) Filed: May 22, 2007

(65) Prior Publication Data
US 2008/0024314 A1    Jan. 31, 2008

Related U.S. Application Data

(60) Provisional application No. 60/834,381, filed on Jul. 31, 2006.

(51) Int. Cl.
*B60C 23/00* (2006.01)
*G06F 3/043* (2006.01)

(52) U.S. Cl. .......................... 340/446; 345/177; 345/173

(58) Field of Classification Search .............. 340/446, 340/644, 691.1, 691.3; 367/117; 310/313 A–313 D; 333/193–196; 345/117, 177, 173; 702/34, 702/84
See application file for complete search history.

(56) References Cited

U.S. PATENT DOCUMENTS

| 4,707,796 | A | * | 11/1987 | Calabro et al. | 702/34 |
|---|---|---|---|---|---|
| 4,772,769 | A | * | 9/1988 | Shumate | 200/314 |
| 4,890,088 | A | * | 12/1989 | Woodell | 340/459 |
| 5,459,282 | A | * | 10/1995 | Willis | 84/645 |
| 5,667,319 | A | * | 9/1997 | Satloff | 400/472 |
| 2003/0201915 | A1 | * | 10/2003 | Anderson et al. | 341/22 |
| 2004/0246239 | A1 | | 12/2004 | Knowles et al. | |
| 2005/0016278 | A1 | | 1/2005 | Knowles et al. | |
| 2006/0012583 | A1 | | 1/2006 | Knowles et al. | |
| 2006/0236624 | A1 | * | 10/2006 | Blair | 52/220.1 |
| 2007/0261895 | A1 | | 11/2007 | Knowles et al. | |

FOREIGN PATENT DOCUMENTS

| DE | 2622482 | 1/1977 |
|---|---|---|
| WO | WO 2005006271 | 1/2005 |

OTHER PUBLICATIONS

International Search Report and Written Opinion for PCT/US2007/014728.

* cited by examiner

*Primary Examiner* — Benjamin C Lee
*Assistant Examiner* — Peter Mehravari
(74) *Attorney, Agent, or Firm* — Mark W. Croll; Paul F. Donovan

(57) ABSTRACT

A self-diagnostic acoustic wave touch actuated switch assembly includes a substrate having an acoustic wave cavity, a transducer operatively connected to the acoustic wave cavity, a processing unit, and at least one light emitting member operatively connected to the processing unit. The transducer is configured to generate a trapped acoustic wave within the acoustic wave cavity. The processing unit is operatively connected to one or both of the acoustic wave cavity and/or the transducer. The processing unit may be configured to activate the at least one light emitting member when the processing unit detects one or both of a switch malfunction and/or a potential switch malfunction.

27 Claims, 4 Drawing Sheets

SELF-DIAGNOSTIC SWITCH

RELATED APPLICATIONS

This application relates to and claims priority benefits from U.S. Provisional Patent Application No. 60/834,381 entitled "Self-Diagnostic Switch/Sensor With Indicator," filed Jul. 31, 2006, which is hereby incorporated by reference in its entirety.

FIELD OF THE INVENTION

Embodiments of the present invention generally relate to switches, and more particularly to a self-diagnostic switch, such as an acoustic wave touch actuated switch that includes an indicator related to operation status.

BACKGROUND OF THE INVENTION

Various assemblies and systems utilize switches, such as electromechanical switches, to activate and deactivate certain applications. Acoustic wave touch actuated switches are used as an alternative to electromechanical switches. Unlike many electromechanical switches, acoustic wave touch actuated switches are rugged, explosion proof, operate well in the presence of liquids and other contaminants, have a lower power consumption, and may be incorporated and integrally formed in a wall of a housing or a device. Examples of acoustic wave switches are shown and described in U.S. Pat. No. 5,673,041, and United States Patent Application Publications US 2002/0126103, US 2002/0149570, US 2004/0051701, US 2004/0227740, and US 2005/0001515.

Typically, a user is not able to discover whether a switch is, or is susceptible to, malfunctioning until the switch is actuated. That is, a user typically discovers a malfunction only after the particular switch is engaged and does not perform as expected. In general, a user is unable to know if a particular switch will properly function until the user actuates the switch.

The operational status of an electromechanical switch is typically determined by the last actuation. As such, a user is unable to know if the switch will malfunction in the future.

Thus, a need exists for a system and method that indicates an actual or potential switch malfunctioning condition before a switch is actuated.

SUMMARY OF THE INVENTION

Certain embodiments of the present invention provide a self-diagnostic switch assembly that includes a main body, a processing unit, and at least one light emitting member, such as a light emitting diode. The main body includes a touch surface configured to be engaged to actuate the switch assembly. The processing unit is operatively connected to the main body, and monitors operation of the switch assembly. The light emitting member is operatively connected to the processing unit. The processing unit activates or deactivates the light emitting member depending on an operating condition of the switch assembly. The switch assembly may be an acoustic wave touch actuated switch assembly, and the main body may be a substrate having an acoustic wave cavity.

Certain embodiments of the present invention provide a self-diagnostic acoustic wave touch actuated switch assembly that includes a substrate, a transducer, a processing unit, and at least one light emitting member. The substrate has an acoustic wave cavity. The transducer is operatively connected to the acoustic wave cavity, and is configured to generate a trapped acoustic wave within the acoustic wave cavity. The processing unit is operatively connected to one or both of the acoustic wave cavity and/or the transducer. The at least one light emitting member is operatively connected to the processing unit.

The processing unit is configured to activate or deactivate the at least one light emitting member when the processing unit detects one or both of a switch malfunction and/or a potential switch malfunction. For example, the processing unit may compare an actual response related to a generated trapped acoustic wave to an acceptable response related to proper switch operation. The processing unit detects proper switch operation when the actual response is within an acceptable response range. Conversely, the processing unit detects the switch malfunction when the actual response is outside of the acceptable response range. Further, the processing unit may detect the potential switch malfunction when the actual response is within the acceptable response range, but outside of a smaller sub-range within the acceptable response range.

The switch assembly may also include a housing secured to the substrate, such that the processing unit is secured within the housing. Additionally, a printed circuit board may be secured with respect to the substrate, and the processing unit may be connected to the printed circuit board. Also, at least one light pipe may be secured to the at least one light emitting member, such that the at least one light emitting member is configured to emit light through the at least one light pipe. For example, the at least one light emitting member may be configured to emit light through the substrate.

The processing unit may activate the at least one light emitting member at a steady state to indicate a first operating condition, a flashing state to indicate a second operating condition, and a deactivated state to indicate a third operating condition. The first operating condition may be a malfunctioning condition, the second operating condition may be a potential malfunctioning condition, and the third operating condition may be a proper functioning condition. Optionally, the processing unit may activate the at least one light emitting member to emit a first colored light to indicate a first operating condition, and a second colored light to indicate a second operating condition.

Figure 1:
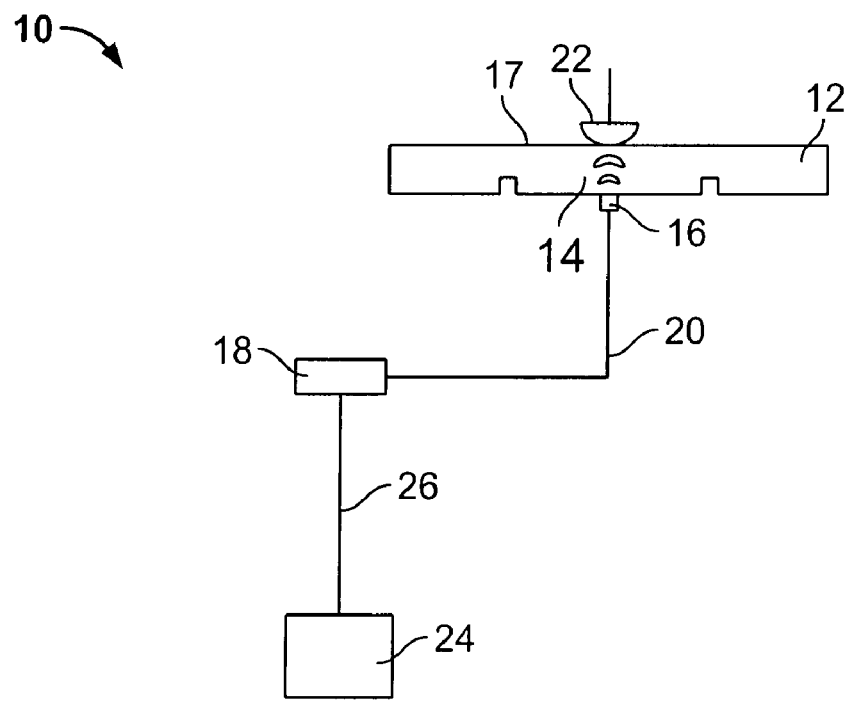
FIG. 1 illustrates a schematic representation of an acoustic wave touch actuated switch according to an embodiment of the present invention.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE INVENTION

FIG. 1 illustrates a schematic representation of an acoustic wave touch actuated switch 10 according to an embodiment of the present invention. The acoustic wave touch actuated switch 10 includes a main body or substrate 12 having an acoustic wave cavity, or resonator, 14 formed therein such that the mass per unit area of the acoustic wave cavity 14 is greater than the mass per unit area of the substrate 12 adjacent the acoustic wave cavity 14. The substrate 12 may be formed of metal, such as aluminum, plastic, or various other materials. A transducer 16 is mounted on the acoustic wave cavity 14. The transducer 16 is configured to generate an acoustic wave that is substantially trapped in the acoustic wave cavity 14. A touch (such as by a finger) on a touch surface 17 of the acoustic wave cavity 14 absorbs acoustic wave energy generated by the transducer 16. A processing unit 18 is in electrical communication with the transducer 16

U.S. Pat. No. 7,106,310, entitled "Acoustic Wave Touch Actuated Switch" (the "'310 patent") which is hereby incorporated by reference in its entirety, discloses a system and method in which a touch on the touch surface 17 of the acoustic wave cavity 14 absorbs acoustic wave energy and produces a detectable change in the impedance of the transducer 16. Moreover, as a user touches the touch surface 17, the resonant frequency changes, which may be detected by the processing unit 18 (e.g., a microprocessor, microcontroller, an integrated circuit, such as an application specific integrate circuit (ASIC), or any other such electronic controller) which is electrically connected to the transducer 16. The acoustic wave switch 10, as described in the '310 patent, has a high Q (the ratio of the stored energy to lost or dissipated energy over a complete cycle) so as to enable a touch to be detected by extremely simple, low-cost circuitry.

Instead of detecting a change in the impedance of the transducer 16, the processing unit 18 may be configured to detect the amount of time the generated trapped acoustic wave 16 "decays" within the acoustic wave cavity 14. United States Patent Application Publication No. 2004/0246239, entitled "Acoustic Wave Touch Detection Circuit and Method" (the "'239 application") which is also hereby incorporated by reference in its entirety, discloses that the processing unit 18 detects a sensed event such as a touch on the acoustic wave cavity 14 based on the decay time. As noted above, the transducer 16 generates a trapped acoustic wave within the acoustic wave cavity 14. The trapped acoustic wave within the acoustic wave cavity 14, or resonator, acts to "ring" the acoustic wave cavity 14. That is, as a voltage is applied to the transducer 16, the transducer 16 operates to resonate the acoustic wave cavity 14. The processing unit 18 may then determine the amount of time it takes the trapped acoustic wave within the acoustic wave cavity 14 to decay.

The processing unit 18 is connected to the transducer 16 through a signal pathway 20. As noted above, the processing unit 18 is configured to detect the decay time of the acoustic wave trapped within the acoustic wave cavity 14 and/or the change in impedance of the transducer 16. By changing the amount of pressure applied at the touch surface 17 and/or through applying pressure on the touch surface 17 through an optional damper 22, the rate of decay and/or impedance changes. Instead of the damper 22, a user may simply touch the touch surface 17 with a finger, which will also absorb acoustic wave energy, thereby producing a change in decay rate and/or impedance.

By ascertaining the effect of acoustic wave absorption, e.g., the actual signal decay over the decay expected in an undamped substrate 12, the processing unit 18 can provide an output signal that varies in correspondence with changes in the pressure applied at the touch surface 17. The detected change may be used to control various functions through signals transmitted from the processing unit 18 to a controller 24 via a signal pathway 26.

The damper 22 may be connected to a remote operator so that variations from the remote operator increase the signal decay by improving contact sensitivity between the damper 22 and the substrate 12, or increasing the contact surface area of the damper 22. The damper 22 may be formed in various shapes. For example, the damper 22 may include a rounded surface. The damper 22 may also be a resilient dome formed of plastic, rubber or the like, that overlays the touch surface 17.

The acoustic wave touch actuated switch 10 is configured to be self-diagnostic. The acoustic wave touch actuated switch 10 is configured to detect changes that occur when the switch 10 is in a steady-state operating condition, without a touch absorbing or damping acoustic wave energy. Controls or adjustments may be incorporated into the processing unit 18 to take advantage of the self-diagnosis that occurs when the switch 10 is activated but operating under an undamped condition.

Figure 2:
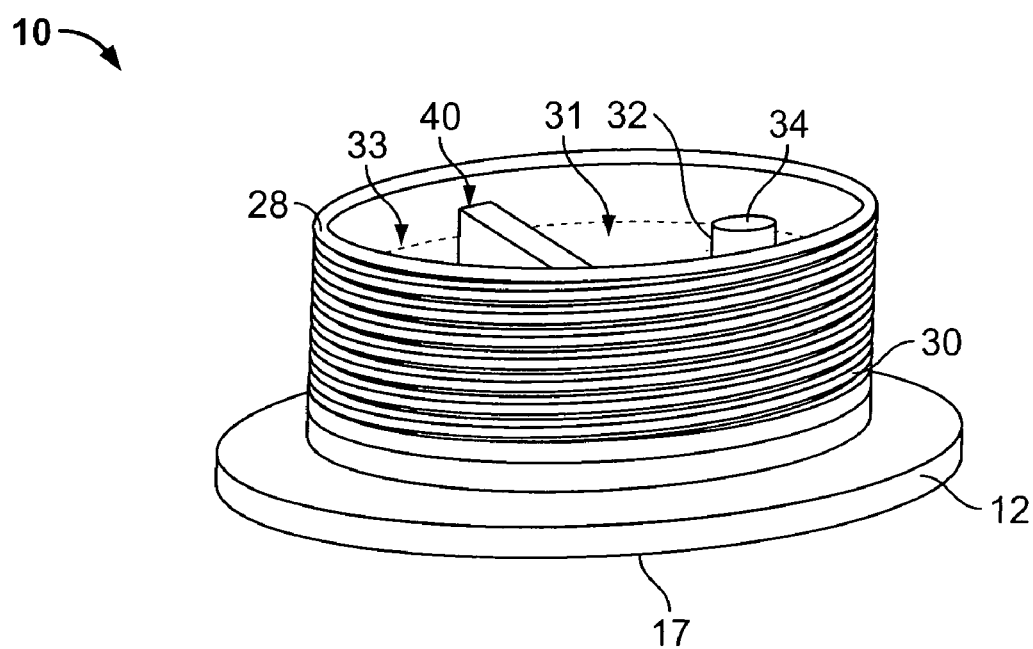
FIG. 2 illustrates an isometric view of an acoustic wave touch actuated switch according to an embodiment of the present invention.

FIG. 2 illustrates an isometric view of the acoustic wave touch actuated switch 10 according to an embodiment of the present invention. The switch 10 includes the substrate 12 having the acoustic wave cavity 14 (not shown in FIG. 2). The touch surface 17 is located on one side of the acoustic wave cavity 14. The transducer 16 (not shown in FIG. 2) is secured to an opposite side of the acoustic wave cavity 14. As noted above, the transducer 16 generates acoustic waves that are trapped within the acoustic wave cavity 14. A housing 28 is secured to the substrate 12 over and/or around the acoustic wave cavity 14. The housing 28 may include threads 30 so that the switch 10 may be threadably secured in a panel having threaded passages or the like, or for insertion through a hole in a panel with fixation completed by engagement of a nut on one side of the panel.

Potting material, such as an opaque potting compound 31, may partially or completely fill a cavity formed within the housing 28. A light pipe 32, such as a clear tube formed of plastic, having an exposed end that serves as a visible status indicator 34 is secured within the housing 28. The exposed end of the light pipe 32 extends through the potting compound 31. The potting compound 31 provides a seal within the housing 28. Instead, of being opaque, the potting compound 31 may be translucent or transparent. With a transparent potting compound, the light pipe 32 may be removed as light emitted by a light emitting member, such as a light emitting diode, may be transmitted through the transparent potting compound.

Figure 3:
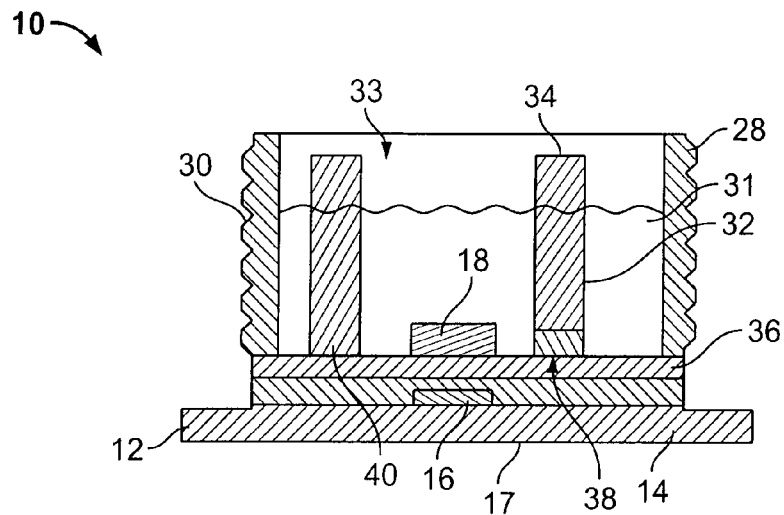
FIG. 3 illustrates a transverse cross-sectional view of an acoustic wave touch actuated switch according to an embodiment of the present invention.

FIG. 3 illustrates a transverse cross-sectional view of the acoustic wave touch actuated switch 10 according to an embodiment of the present invention. Referring to FIGS. 2 and 3, a printed circuit board (PCB) 36 is secured within the housing 28. The PCB 36 may be snapably, latchably, or threadably secured to an interior surface of the housing 28. Optionally, the PCB 36 may be secured to the housing 28 through various fasteners or adhesives. As shown in FIG. 3, the PCB 36 is positioned over the transducer 16. The processing unit 18 is electrically connected to the PCB 36, and may be supported by, or secured to, the PCB 36. At least one light emitting diode (LED) 38, or other such light emitting device, is operatively connected to the processing unit 18 and/or the PCB 36. The LED 38 may be operatively connected to the light pipe 32. Optionally, the LED 38 may simply be aligned with the light pipe 32 such that light emitted by the LED 38 passes through the light pipe 32 into and through the visible status indicator 34. Additionally, an input/output (I/O) connector 40 is also connected to the PCB 36.

The processing unit 18, the LED 38, and the I/O connector 40 may all be connected to the PCB 36, and are all contained within a cavity 33 of the housing 28. As noted above, the cavity 33 is at least partially filled with a potting compound 31. The light pipe 32 is positioned above the LED 38 and extends through the potting compound 31 so that the exposed end serves as the visible status indicator 34. Similarly, the I/O connector 40 has an end that extends through the potting compound 31. The exposed end of the I/O connector 40 allows for external connection to a power source, or various devices, such as a computer.

The switch 10 is configured to report self-diagnostic performance when the transducer 16 generates acoustic wave energy into the acoustic wave cavity 14. Upon detecting specific responses, the processing unit 18 reports readings that lie outside a predetermined set of operating criteria. For example, the decay rate of a trapped acoustic wave within a properly functioning switch 10 may be established at a particular constant when the switch 10 is not actuated (i.e., when no finger or damping material contacts the touch surface 17). This constant is stored within a memory of the processing unit 18. The processing unit 18 compares decay rates of subsequently generated trapped acoustic waves against the stored established constant. When the processing unit 18 detects that a subsequent, actual decay rate varies from the established constant when there is nothing touching the touch surface 17, the processing unit 18 detects an error condition. That is, variance from the established constant indicates that the switch 10 is not functioning properly.

The processing unit 18 may detect impedance changes of the transducer 16 and determine error conditions in a similar fashion. That is, the processing unit 18 may be configured to store an established change of impedance of the transducer 16 when an acoustic wave is generated when the touch surface 17 is not touched within a memory. The processing unit 18 compares subsequent impedance changes against the stored established change of impedance. When a subsequent change of impedance varies from the known quantity, i.e., the stored established change of impedance, the processing unit 18 determines that the switch is malfunctioning.

When the processing unit 18 determines an error condition, the processing unit 18 activates the LED 38. The LED 38 then emits light that is passed through the light pipe 32 that passes out the visible status indicator 34, thereby providing a readily-detectable indication that the switch 10 is not functioning properly.

The processing unit 18 may compare the decay rate and impedance responses to a corresponding acceptable response range. If the actual response falls outside of that range, then the processing unit 18 determines that an actual malfunction has occurred. If, however, the response is within the range, but falls outside of a smaller sub-range, the processing unit 18 may determine that the switch 10 is susceptible to malfunction, and may provide an appropriate visual indication.

In one embodiment, the LED 38 may emit a steady-state light that indicates proper switch operation. Optionally, a steady-state light may indicate an error condition, while no light indicates proper operation. A flashing light, or no light at all, may indicate an error condition. Optionally, a flashing light may indicate a potential malfunction, such as when the actual response time falls outside of a response sub-range, but is still within a larger overall response range. Also, alternatively, different colored lights may be used to indicate different switch status. For example, a green light may indicate proper operation, a yellow light may indicate potential malfunction, while a red light may indicate an actual malfunction. Additionally, the switch 10 may include more light pipes and LEDs than those shown. The processing unit 18 may be configured to activate the LEDs to provide a variety of combinations of steady light (of the same or different color), flashing light (or the same or different color), and/or no light to provide multiple status indications.

Figure 4:
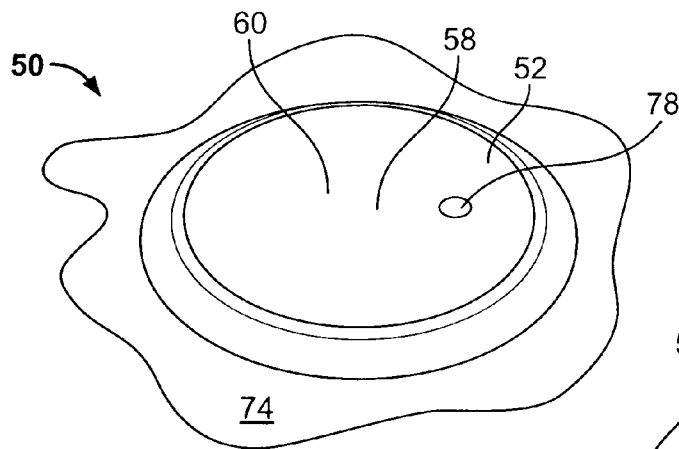
FIG. 4 illustrates an isometric top view of an acoustic wave touch actuated switch according to an embodiment of the present invention.
Figure 5:
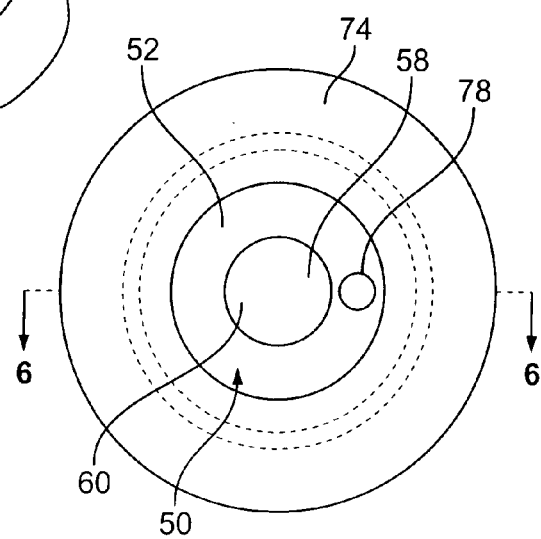
FIG. 5 illustrates a top view of an acoustic wave touch actuated switch according to an embodiment of the present invention.
Figure 6:
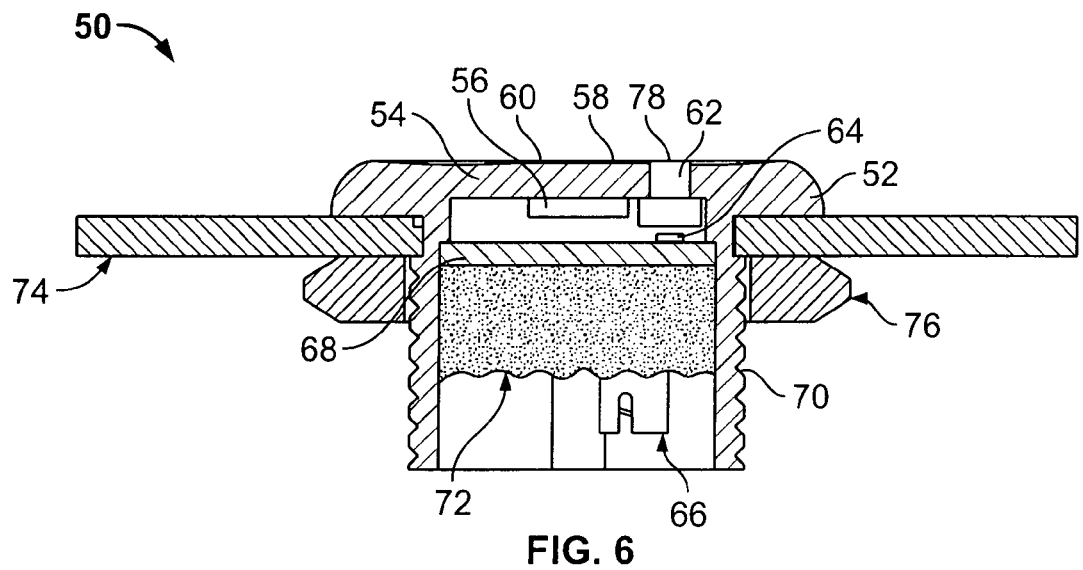
FIG. 6 illustrates a cross-sectional view of an acoustic wave touch actuated switch through line 6-6 of FIG. 5 according to an embodiment of the present invention.

FIG. 4 illustrates an isometric top view of an acoustic wave touch actuated switch 50 according to an embodiment of the present invention. FIG. 5 illustrates a top view of the acoustic wave touch actuated switch 50, while FIG. 6 illustrates a cross-sectional view of the acoustic wave touch actuated switch 50 through line 6-6 of FIG. 5. The switch 50 operates similar to the switch 10 shown and described with respect to FIGS. 1-3.

Referring to FIGS. 4-6, the switch 50 includes a substrate 52 having an acoustic wave cavity 54, as discussed above. A transducer 56 is positioned on a side of the acoustic wave cavity 54 that is opposite a touch surface 58. A damping member 60, such as a resilient dome or membrane providing tactility, may be positioned over the touch surface 58. A light pipe 62 extends from an LED 64 through the substrate 52. An I/O connector 66 downwardly extends from a PCB 68 secured within a housing 70. Potting material 72 covers and protects the PCB 68. The switch 50 is mounted to a panel 74 of a device. The switch 50 may be securely fastened to the panel 74 through a nut 76 that engages threads on the housing 70. That is, as the housing 70 is passed through an opening formed in the panel 74, and the nut 76 securely engages the threaded outer surface of the housing 70. The diameter of the substrate 52 is larger than that of the opening within the panel 74. As such, the switch 50 is prevented from passing through the opening.

The switch 50 operates similarly to the switch 10, except that the light pipe 62 extends through the substrate 52 such that the visible status indicator 78 is visible through or above the substrate 52. Thus, the switch 50 may be particularly suitable for finger actuated applications in which a user is able to readily see the touch surface 58 and/or optional damping member 60. When the processing unit (hidden from view in FIGS. 4-6) connected to the PCB 68 detects an error condition, the processing unit activates the LED to emit light through the light pipe 62. Because the resulting light is emitted through the substrate 52 proximate, or on, the touch surface 58, a user can readily see whether an error condition exists.

Figure 7:
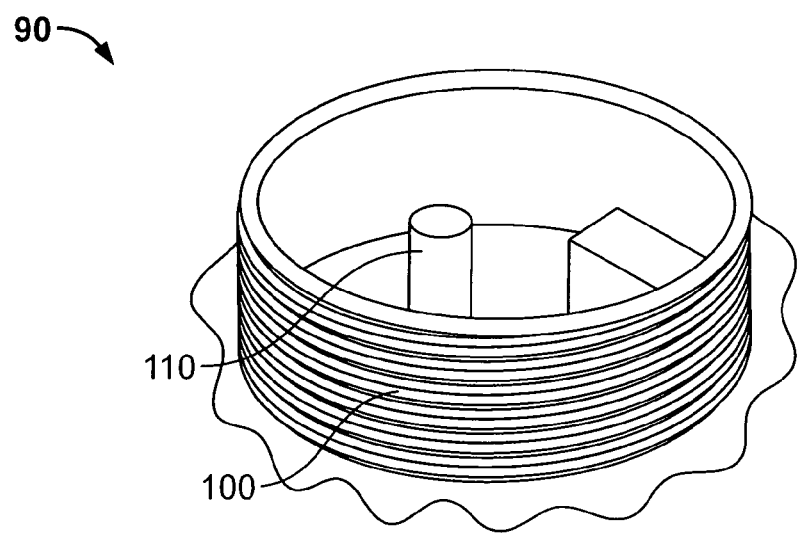
FIG. 7 illustrates an isometric bottom view of an acoustic wave touch actuated switch according to an embodiment of the present invention.
Figure 8:
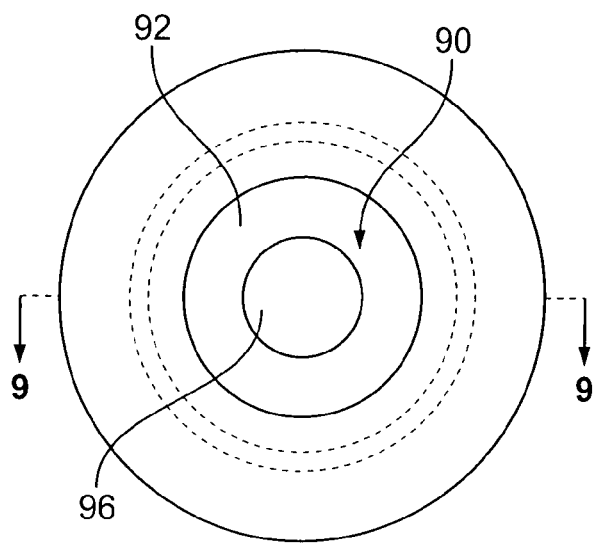
FIG. 8 illustrates a top view of an acoustic wave touch actuated switch according to an embodiment of the present invention.
Figure 9:
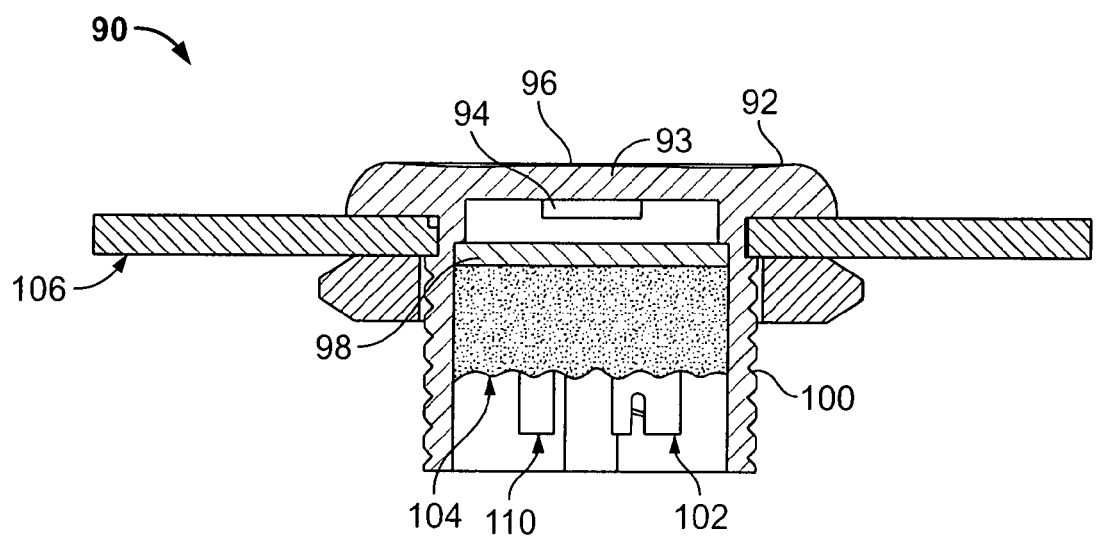
FIG. 9 illustrates a cross-sectional view of an acoustic wave touch actuated switch through line 9-9 of FIG. 8 according to an embodiment of the present invention.

FIG. 7 illustrates an isometric bottom view of an acoustic wave touch actuated switch 90 according to an embodiment of the present invention. FIG. 8 illustrates a top view of the acoustic wave touch actuated switch 90, while FIG. 9 illustrates a cross-sectional view of the acoustic wave touch actuated switch 90 through line 9-9 of FIG. 8. The switch 90 operates similar to the switch 10 shown and described with respect to FIGS. 1-3.

Referring to FIGS. 7-9, similar to the embodiments discussed above, the switch 90 includes a substrate 92 having an acoustic wave cavity 93. A transducer 94 is positioned on one side of the acoustic wave cavity 93 opposite a touch surface 96. A damping member may be positioned over the touch surface 96.

A PCB 98 is secured within a housing 100 secured to the substrate 92. A processing unit (hidden from view in FIGS. 7-9) is secured to the PCB 98. An I/O connector 102 extends from the PCB through potting material 104 within a cavity of the housing 100. The switch 90 is secured to a panel 106, as discussed above with respect to FIGS. 4-6. The switch 90 includes a light pipe 110 operatively connected to, and/or aligned with, an LED (hidden by the potting material 104). As shown in FIGS. 7 and 9, the light pipe 110 extends downwardly through the potting material 104, instead of through the substrate 92.

While the embodiments described above include light pipes extending above or below the substrate, the light pipes may extend through various areas of the switches. For example, a light pipe operatively connected to an LED may extend through a wall of a housing.

The I/O connectors shown and described above may be used to operatively connect a particular switch to a source of power. Additionally, I/O connectors may be used to connect PCBs to a computer or the like, so that field changes may be made to the software utilized by the processing units of the switches to change the operating and/or diagnostic parameters, provide additional data to, or acquire data from, the switches.

While the embodiments of the present invention have been described with respect to an acoustic wave switch, embodiments of the present invention may be used with various switch assemblies. For example, a processing unit may be operatively connected to a main body of an electromechanical or membrane switch in order to monitor proper switch operation.

Thus, embodiments of the present invention provide a system and method that indicates an actual or potential switch malfunctioning condition before a switch is even actuated. As described above, the processing unit is operable to detect an operational malfunction and activate an LED to emit light in order to indicate that the switch is not operating properly. The processing unit operates in such a way whether or not a user is engaging the switch. As such, the embodiments of the present invention are capable of informing a user that a device is malfunctioning or susceptible to malfunctioning in the future.

Embodiments of the present invention provide a self-diagnostic switch that is able to indicate switch malfunction and/or a request for service. The switches shown and described are simple, single elements connected to a system or device that requires initiation of on/off functions from a standard power switch or sensor. With the intelligence of processing units built into the switches, self-diagnostic reporting features are possible. Embodiments of the present invention provide an inexpensive visual diagnostic indicator in which an equipment manufacturer, technician, or end user can determine the operating performance of a switch or sensor, even without microprocessor intelligence contained within the end product in which the switch or sensor is installed. The switch or sensor itself includes the necessary processing intelligence for self-diagnosis and reporting, and the switch or sensor may be easily mounted in the system or assembly. The switches may be electrically connected to the system or assembly via I/O connectors provided in the switches.

While various spatial terms, such as front, rear, upper, bottom, lower, mid, lateral, horizontal, vertical, and the like may used to describe embodiments of the present invention, it is understood that such terms are merely used with respect to the orientations shown in the drawings. The orientations may be inverted, rotated, or otherwise changed, such that a front portion is a rear portion, and vice versa, horizontal becomes vertical, and the like.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

The invention claimed is:

1. A self-diagnostic acoustic wave touch actuated switch assembly comprising:
    a substrate including an acoustic wave cavity having a touch surface;
    a housing integrally connected to said substrate, wherein said housing extends over, under, or around said acoustic wave cavity to define a perimeter, said housing configured to be inserted into a panel such that said perimeter defined by said housing is disposed in said panel while said touch surface of said substrate is disposed outside said panel;
    a transducer operatively connected to said acoustic wave cavity and disposed within said perimeter that is defined by said housing, said transducer configured to generate a trapped acoustic wave within said acoustic wave cavity;
    a processing unit operatively connected to at least one of said acoustic wave cavity or said transducer, said processing unit being secured within said perimeter that is defined by said housing; and
    at least one light emitting member operatively connected to said processing unit, said at least one light emitting member being directly fixed to said substrate proximate to said transducer within said perimeter that is defined by said housing, wherein said processing unit activates or deactivates said at least one light emitting member depending on an operating condition of the switch assembly.

2. The switch assembly of claim 1, wherein said processing unit is configured to activate or deactivate said at least one light emitting member when said processing unit detects at least one of a switch malfunction or a potential switch malfunction.

3. The switch assembly of claim 2, wherein said processing unit compares an actual response related to a generated trapped acoustic wave to an acceptable response related to proper switch operation.

4. The switch assembly of claim 3, wherein said processing unit detects proper switch operation when the actual response is within an acceptable response range, and wherein said processing unit detects the switch malfunction when the actual response is outside of the acceptable response range.

5. The switch assembly of claim 4, wherein said processing unit detects the potential switch malfunction when the actual response is within the acceptable response range, but outside of a smaller sub-range within the acceptable response range.

6. The switch assembly of claim 1, wherein said at least one light emitting member comprises at least one light emitting diode.

7. The switch assembly of claim 1, further comprising a printed circuit board secured with respect to said substrate, said processing unit being connected to said printed circuit board within said perimeter that is defined by said housing.

8. The switch assembly of claim 1, further comprising at least one input/output connector.

9. The switch assembly of claim 1, further comprising at least one light pipe disposed within said perimeter that is defined by said housing, said at least one light pipe secured to said at least one light emitting member, said at least one light emitting member configured to emit light through said at least one light pipe.

10. The switch assembly of claim 1, wherein said at least one light emitting member is configured to emit light through said substrate.

11. The switch assembly of claim 1, wherein said processing unit activates said at least one light emitting member at a steady state to indicate a first operating condition, a flashing state to indicate a second operating condition, and a deactivated state to indicate a third operating condition.

12. The switch assembly of claim 11, wherein the first operating condition is a malfunctioning condition, the second operating condition is a potential malfunctioning condition, and the third operating condition is a proper functioning condition.

13. The switch assembly of claim 1, wherein said processing unit activates said at least one light emitting member to emit a first colored light to indicate a first operating condition, and a second colored light to indicate a second operating condition.

14. A self-diagnostic acoustic wave touch actuated switch assembly comprising:
a substrate including an acoustic wave cavity having a touch surface;
a transducer operatively connected to said acoustic wave cavity, said transducer configured to generate a trapped acoustic wave within said acoustic wave cavity;
a housing integrally connected to said substrate, wherein said housing extends over, under, or around said acoustic wave cavity to define a perimeter, said housing configured to be inserted into a panel such that said perimeter defined by said housing is disposed within said panel with said touch surface of said substrate disposed outside of said panel;
a printed circuit board secured within said perimeter that is defined by said housing;
a processing unit operatively connected to at least one of said acoustic wave cavity or said transducer, said processing unit being connected to said printed circuit board, said processing unit and said printed circuit board being secured within said perimeter that is defined by said housing;
at least one light emitting member operatively connected to said processing unit, said at least one light emitting member being secured within said perimeter that is defined by said housing, wherein said at least one light emitting member is directly fixed to said substrate proximate to said transducer;
at least one light pipe disposed in said perimeter defined by said housing and secured to said at least one light emitting member, said at least one light emitting member configured to emit light through said at least one light pipe; and
at least one input/output connector disposed within said perimeter defined by said housing and connected to said processing unit, wherein said processing unit activates or deactivates said at least one light emitting member depending on an operating condition of the switch assembly.

15. The switch assembly of claim 14, wherein said processing unit is configured to activate or deactivate said at least one light emitting member when said processing unit detects at least one of a switch malfunction or a potential switch malfunction, wherein said processing unit compares an actual response related to a generated trapped acoustic wave to an acceptable response related to proper switch operation, wherein said processing unit detects proper switch operation when the actual response is within an acceptable response range, and wherein said processing unit detects the switch malfunction when the actual response is outside of the acceptable response range, and wherein said processing unit detects the potential switch malfunction when the actual response is within the acceptable response range, but outside of a smaller sub-range within the acceptable response range.

16. The switch assembly of claim 14, wherein said at least one light emitting member is configured to emit light through said substrate.

17. The switch assembly of claim 14, wherein said processing unit activates said at least one light emitting member at a steady state to indicate a first operating condition, a flashing state to indicate a second operating condition, and a deactivated state to indicate a third operating condition, wherein the first operating condition is a malfunctioning condition, the second operating condition is a potential malfunctioning condition, and the third operating condition is a proper functioning condition.

18. The switch assembly of claim 14, wherein said processing unit activates said at least one light emitting member to emit a first colored light to indicate a first operating condition, and a second colored light to indicate a second operating condition.

19. A self-diagnostic acoustic wave touch actuated switch assembly comprising:
a housing configured to be inserted into a panel;
a substrate integrally connected to said housing, said substrate including an acoustic wave cavity having a touch surface configured to be engaged to actuate the switch assembly, wherein said housing extends over, under, or around said acoustic wave cavity to define a perimeter and such that said touch surface of said substrate is disposed outside of said panel;
a processing unit disposed within said perimeter defined by said housing, said processing unit monitoring operation of the switch assembly; and
at least one light emitting member disposed within said perimeter defined by said housing and operatively connected to said processing unit, wherein said at least one light emitting member is directly fixed to said substrate proximate a transducer, said processing unit activating or deactivating said at least one light emitting member depending on an operating condition of the switch assembly.

20. The switch assembly of claim 9, wherein said at least one light pipe extends through said touch surface.

21. The self-diagnostic acoustic wave touch actuated switch assembly of claim 19, further comprising at least one light pipe secured to said at least one light emitting member, said at least one light pipe extending through said touch surface.

22. The self-diagnostic switch of claim 1, wherein said housing comprises a threaded outer surface, wherein said housing is configured to be threadably secured to a panel through said threaded outer surface.

23. The self-diagnostic switch of claim 14, wherein said housing comprises a threaded outer surface, wherein said housing is configured to be threadably secured to a panel through said threaded outer surface.

24. The self-diagnostic switch of claim 19, wherein said housing comprises a threaded outer surface, wherein said housing is configured to be threadably secured to a panel through said threaded outer surface.

25. The switch assembly of claim 9, wherein said at least one light pipe is entirely disposed within said perimeter that is defined by said housing.

26. The self-diagnostic acoustic switch of claim 14, wherein said at least one light pipe is entirely disposed within said perimeter that is defined by said housing.

27. The self-diagnostic switch of claim 21, wherein said at least one light pipe is entirely disposed within said perimeter that is defined by said housing.

* * * * *